United States Patent [19]

Kakehi et al.

[11] Patent Number: 4,824,309
[45] Date of Patent: Apr. 25, 1989

[54] VACUUM PROCESSING UNIT AND APPARATUS

[75] Inventors: Yutaka Kakehi, Hikari; Norio Nakazato, Kudamatsu; Yoshimasa Fukushima, Hikari; Fumio Shibata, Kudamatsu; Tsunehiko Tsubone, Kudamatsu; Norio Kanai, Kudamatsu, all of Japan

[73] Assignee: Hitachi, Ltd., Tokyo, Japan

[21] Appl. No.: 904,202

[22] Filed: Sep. 8, 1986

Related U.S. Application Data

[63] Continuation of Ser. No. 674,772, Nov. 26, 1984, abandoned.

[30] Foreign Application Priority Data

Nov. 28, 1983 [JP] Japan .................................. 58-222004

[51] Int. Cl.⁴ ............................................ B65G 65/00
[52] U.S. Cl. ...................................... 414/217; 118/50; 414/222
[58] Field of Search ................. 414/217, 222, 331; 118/50, 500, 719, 729

[56] References Cited

U.S. PATENT DOCUMENTS

| | | | |
|---|---|---|---|
| 3,902,615 | 9/1975 | Levy et al. | 414/416 X |
| 4,278,380 | 7/1981 | Guarino | 414/217 |
| 4,405,435 | 9/1983 | Tateishi et al. | 414/225 X |
| 4,483,651 | 11/1984 | Nakane et al. | 414/222 X |
| 4,553,069 | 11/1985 | Purser | 414/331 X |
| 4,619,573 | 10/1986 | Rathmann et al. | 414/331 X |

Primary Examiner—Frank L. Werner
Assistant Examiner—David A. Bucci
Attorney, Agent, or Firm—Antonelli, Terry & Wands

[57] ABSTRACT

A vacuum processing unit and apparatus comprises a buffer chamber that can be evacuated, a processing chamber that can be communicated with said buffer chamber a first sample carrier installed in said buffer chamber, a vacuum opening/closing device provided in the buffer chamber to correspond to the first sample carrier, a vacuum prechamber provided for the buffer chamber via the vacuum opening/closing device, a second sample carrier which carries the sample between the vacuum prechamber and the first sample carrier via the vacuum opening/closing device, and a third sample carrier which carries the sample between said first sample carrier and the processing chamber. The vacuum processing units can be connected in groups via vacuum opening/closing devices provided for the buffer chambers in locations corresponding to the end of the first sample carriers therein. The number of connected processing chambers can be freely changed to meet a change in the process or the manufacturing line.

9 Claims, 4 Drawing Sheets

VACUUM PROCESSING UNIT AND APPARATUS

This is a continuation of application Ser. No. 674,772, filed Nov. 26, 1984, now abandoned.

BACKGROUND OF THE INVENTION

Field of the Invention

The present invention relates to a vacuum processing unit and apparatus, and, more particularly, to a vacuum processing unit and apparatus adapted to the manufacture of semiconductor integrated circuit elements, such as dry etching devices as represented by plasma etching devices, reactive sputter etching devices or microwave etching devices, and plasma CVD devices, sputtering devices, or the like.

In recent years, processing techniques for manufacturing semiconductor integrated circuit elements has developed remarkably. For instance, a dry etching device that is capable of processing patterns of the order of 1 $\mu$m attracting attention. As the patterns become so fine, the semiconductor element substrates (hereinafter referred to as substrate) tend to have a large diameter. Therefore, it is a difficult task to increase the output, i.e., number of substrates processed per unit time per floor area occupied by the apparatus for manufacturing semiconductor devices, and to perform the various techniques in the manufacturing process.

To satisfy such requirements, it is necessary to reduce the size of the apparatus, and to perform multipurpose processing using a plurality of processing chambers. Moreover, there has been a demand for a vacuum processing module which permits the number of processing chambers to be freely changed to constitute or assemble a system to cope with a change in the process or to cope with a change in the manufacturing line.

According to a conventional apparatus with an increased number of modules consisting of a processing chamber and a substrate carrier line in the open air as disclosed, for example, in Japanese Patent Laid-Open No. 128928/1982, the substrate is carried to the next processing chamber exposed to air that may not be very clean. Therefore, this apparatus is not adapted to the process which, during the processing operation, hands the process over to the next processing chamber.

Further, according to an apparatus in which the substrates are carried between several processing chambers and one buffer chamber, and are continuously processed such as disclosed, for example in Japanese Utility Model Laid-Open No. 39430/1982, the number of processing chambers is fixed. That is, it is not permissible to change the number of processing chambers in response to a change in the process or the change in the manufacturing line. This is a great inconvenience.

The object of the present invention is to provide a vacuum processing unit and apparatus which permits the number of processing chambers to be freely changed to constitute or assemble the system to cope with a change in the process or a change in the line.

In accordance with the present invention, a vacuum processing unit is proposed which includes a processing chamber which processes a sample under a vacuum, and a buffer chamber which is adapted to be evacuated and adapted to communicate with the processing chamber. A vacuum pre-chamber is provided in the buffer chamber by way of a vacuum opening/closing means. A sample carrier means is provided which carries the sample between the vacuum prechamber and the buffer chamber, inside the buffer chamber and between the buffer chamber and the processing chamber. The buffer chamber is provided with an opening which can be opened and closed at a place different from the place of the vacuum opening and closing means, where the sample can be removed and delivered between the sample carrier means to carry the sample inside the buffer chamber and outside of the buffer chamber.

According to the present invention, a plurality of units can be connected via an opening provided in the buffer chamber, Thus, the vacuum processing apparatus permits the number of vacuum processing chambers to be freely changed to constitute or assemble a system to cope with the change in the process or the change in the line.

DETAILED DESCRIPTION

Figure 4A:
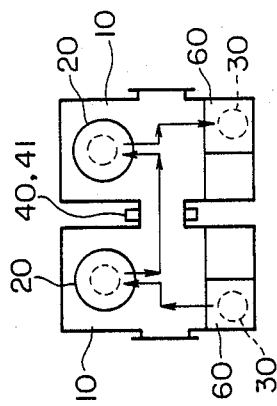
FIGS. 4(a) to 4(c) are schematic views of sample processing modes in the vacuum processing apparatus consisting of paired units.

An embodiment of the present invention will be described below in conjunction with FIGS. 1 to 5. Referring now to the drawings wherein like reference numerals are used throughout the various views to designate like parts and, more particularly, to FIG. 1, according to this Figure a vacuum processing unit includes a buffer chamber 10 that can be evacuated, a processing chamber 20 communicable with the buffer chamber 10, and a first sample carrier means installed in the buffer chamber 10 to carry a substrate 30 which is a sample in a direction of arrow A. A first vacuum opening/closing means 40, 41, such as, for example, gate valves or separator fittings are provided in the side walls of the buffer chamber 10 to correspond to both ends of the first sample carrier means, with a vacuum pre-chamber 60 being provided in the buffer chamber 10 via second vacuum opening/closing means 50, 51 such as, for example, gate valves provided in a side wall opposed to the processing chamber 20 via the first sample carrier means at right angles with the side walls in which the first vacuum opening/closing means 40, 41 are provided. A second sample carrier means carries the substrate 30 between the vacuum pre-chamber 60 and the first sample carrier means via the second vacuum opening/closing means 50, 51 in the directions of arrows B and C, and a sample transfer means is provided on a sample carrier path of the first sample carrier means to correspond to the processing chamber 20. A third sample carrier means which carries the substrate 30 between the first sample carrier means and the processing chamber 20 in a direction of arrow D.

A cassette table (not shown) of a cassette hoist device (not shown), for raising and lowering the substrate cassettes 70, 71 is provided in the vacuum pre-chamber 60 to correspond to the vacuum opening/closing means 50, 51. The first, second and third sample carrier means and the sample transfer means will be described in further detail in conjunction with FIG. 2.

Figure 2:
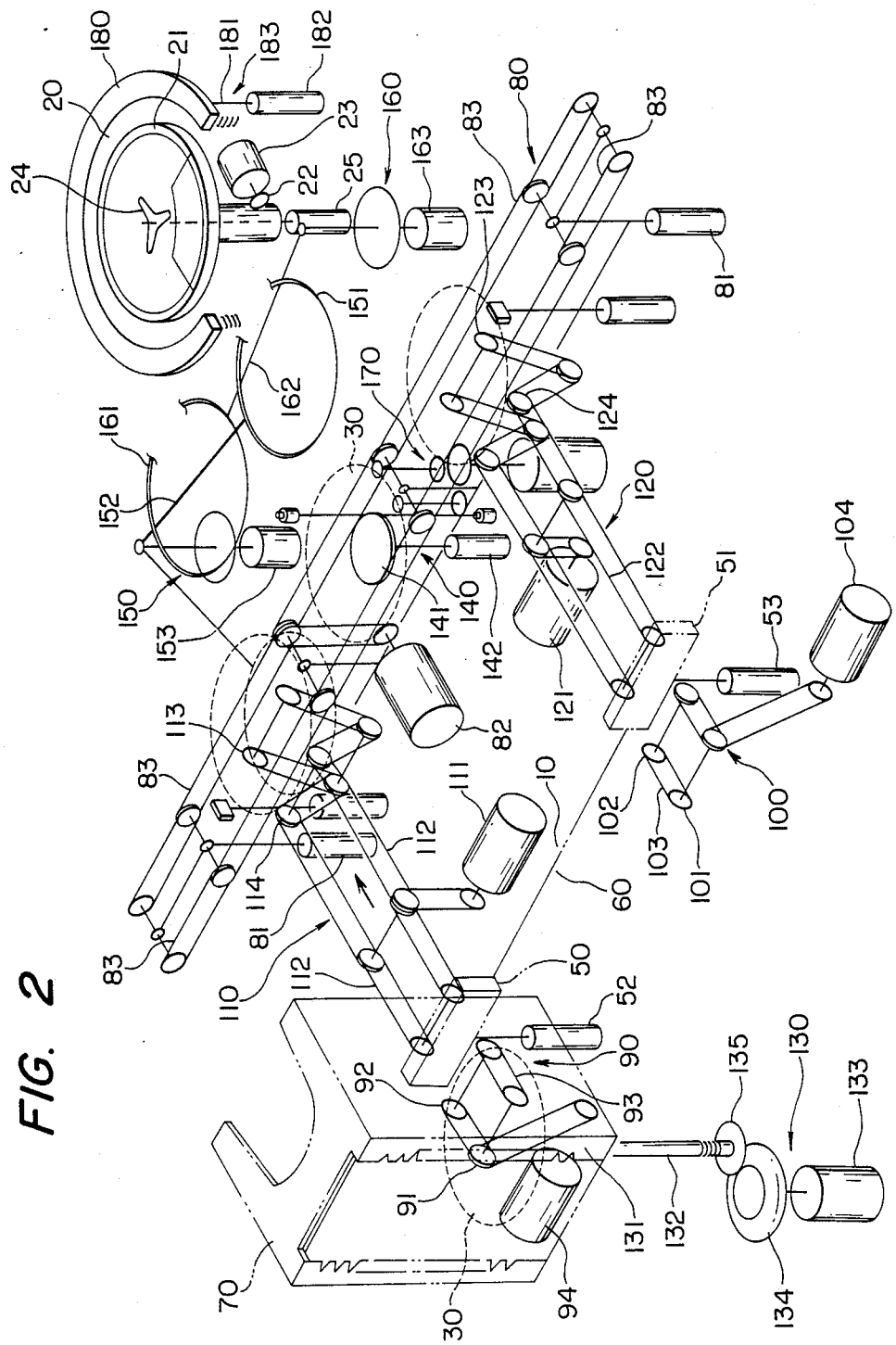
FIG. 2 is a perspective schematic view of sample carrier means in the vacuum processing unit of FIG. 1.

As shown in FIG. 2, the first sample carrier means includes a belt carrier device 80 which can be wholly raised or lowered by, for example, cylinders 81, and a belt 83 of the belt carrier device 80 is driven by a motor 82.

The second sample carrier means includes belt carrier devices 90, 100 installed in the vacuum pre-chamber 60, and belt carrier devices 110, 120 installed in the buffer chamber 10, with the second vacuum opening/closing means 50, 51 interposed therebetween.

Pulleys 91, 92 of the belt carrier device 90, and a belt 93 which runs endlessly around the pulleys 91, 92, are aligned with a cassette table 131 of the cassette hoist device 130, and are disposed over the cassette table 131 even when the cassette table 131 is raised to its highest position, with the belt 93 being driven by a motor 94.

A belt 112 in the belt carrier device 110 is driven by a motor 111. The end of the belt carrier device 110, on the side of the belt carrier device 80, is folded in a V-shape, so that ascending-descending motion of the belt 83 on one side of the belt carrier device 80 will not be hindered. A pulley 113 at the final end is positioned between the belts 83 of the belt carrier device 80. Here, the belt 93 of the belt carrier device 90 is flush with the belt 112 of the belt carrier device 110, and the distance between the belt carrier device 90 and the belt carrier device 110 at the end of the second vacuum opening/closing means 50 has been selected so as not to hinder the transfer of substrate 30.

Pulleys 101, 102 of the belt carrier device 100, and a belt 103 that runs endlessly around the pulleys 101, 102, are arranged in the same manner as those of the belt carrier device 90' and the belt 103 is driven by a motor 104.

A belt 122 of a belt carrier device 120 is driven by a motor 121. The end of the belt carrier device 120, on the side of the belt carrier device 80, is folded in a V-shape like in the belt carrier device 110, so as not to hinder the ascending-descending motion of the belt 83 on one side of the belt carrier device 80. A pulley 123 at the final end is positioned between the belts 83 of the belt carrier device 80. The belt 103 of the belt carrier device 100 is flush with the belt 122 of the belt carrier device 120, and the distance between the belt carrier device 100 and the belt carrier device 120 on the side of the second vacuum opening/closing means 51 has been so selected as not to hinder the transfer of substrate 30. The distance between the pulley 113 of the belt carrier device 110 and a pulley 114 opposite pulley 113, is selected so that the substrate 30 is prevented from falling and is favorably transferred. The distance between the pulley 123 of the belt carrier device 120 and the opposite pulley 124 is also selected to be the same length. The belt carrier device 80 can be raised or lowered such that the level of belts 83 becomes higher than, or lower than, the level of belts 112, 122 of the belt carrier devices 110, 120.

The sample transfer means 140 includes a sample table 141 of a size smaller than the distance between the belts 83 of belt carrier device 80, and a hoist means such as cylinder 142. The sample table 141 is raised or lowered by the cylinder 142 passing between the belts 83 of belt carrier device 80 at a position directly opposite the processing chamber 20 or, in this case, at a position between the belt carrier devices 110, 120.

The third sample carrier means includes arm carrier devices 150, 160, with the arm carrier device 150 including a sample scoop fitting 151, an arm 152, and a rotating device such as a pulse motor 153. The pulse motor 153 is provided between the belt carrier device 80 and the processing chamber 20, and on one side (left side in FIG. 2) divided by a line that connects the center of the sample table 141 of sample transfer means 140 to the center of a substrate electrode 21 of processing chamber 20. An end of the arm 152 is fastened to the pulse motor 153. The other end of arm 152 is fastened to the sample scoop fitting 151. The arm carrier device 160 consists of a sample scoop fitting 161, an arm 162 and a rotating device such as a pulse motor 163. The pulse motor 163 is provided between the belt carrier device 80 and the processing chamber 20, and on the other side (right side in FIG. 2) of the line that connects the center of the sample table 141 of sample transfer means 140 to the center of the substrate electrode 21 of processing chamber 20. An end of the arm 162 is fastened to the pulse motor 163. The other end of arm 162 is fastened to the sample scoop fitting 161.

The sample scoop fittings 151, 161 and arms 152, 162 are capable of scooping with scoop fittings 151, 161 the substrates 30 that are placed on the sample table 141 and on the substrate electrode 21. The arms 152, 162 are partially rotated by pulse motors 153, 163, such that the substrates 30 can be carried by the sample scoop fittings 151, 161 between the sample table 141 and the substrate electrode 21.

Here, the arms 152, 162 move on different planes; i.e., the arm 152 moves on the upper plane and the arm 162 moves on the lower plane. For instance, when the substrate 30 is to be carried by the arm carrier device 150 from the sample table 141 to the substrate electrode 21, the other substrate 30 is not interfered with as it is carried by the arm carrier device 160 from the substrate electrode 21 to the sample table 141.

The cassette hoist device 130 includes a cassette table 131, a hoist rod 132 which hangs perpendicularly from the cassette table 131 and which is threaded on the lower end thereof, a gear 134 driven by a motor 133, and a gear 135 which meshes with the gear 134 and into which the lower end of the hoist rod 132 is screwed.

The substrate electrode 21 is raised and lowered by the turn of a motor 23 via a rack-and-pinion mechanism 22. Further, at the center of the substrate electrode 21 is provided a pin 24 that supports the substrate so as to be raised and lowered by a hoist device such as a cylinder 25. The pin 24 is raised and lowered between a position where the surface of the pin 24 is lower than the surface of the substrate electrode 21 and a position where the substrate 30 can be handed over to the substrate scoop fittings 151, 161 of the arm carrier devices 150, 160.

The vacuum processing unit shown in FIGS. 1 and 2 processes the substrate as described below.

First, the cassette table 131 corresponding to the second vacuum opening/closing means 50 is raised to the uppermost position, and the cassette table (not shown) corresponding to the second vacuum opening/closing means 51 is lowered to the lowermost position. The second vacuum opening/closing means 50, 51 are closed, for example, by the cylinders 52, 53, whereby communication between the buffer chamber 10 and the vacuum pre-chamber 60 is hermetically sealed off. Further, the first vacuum opening/closing means 40, 41 are closed or separated, so that communication between the buffer chamber 10 and the open air is hermetically sealed off. Under these conditions, a vacuum pump (not shown) is actuated so that the pressure in the buffer chamber 10 is reduced to a predetermined value.

When the outer portion is exposed to the open air, an open air-vacuum opening/closing means (not shown) such as a door is opened, which is provided for the vacuum pre-chamber 60 to introduce therein a substrate cassette (hereinafter referred to as the supply cassette) 70 accommodating a predetermined number of substrates 30 and an empty cassette 71 for recovering the substrates (hereinafter referred to as recovery cassette). The supply cassette 70 is placed on the cassette table 131 that corresponds to the second vacuum opening/closing means 50, and the recovery cassette 71 is placed on the cassette table that corresponds to the second vacuum opening/closing means 51.

Thereafter, the open air-vacuum opening/closing means is closed, and the pressure in the vacuum pre-chamber 60 is reduced by the vacuum pump (not shown) to a value nearly equal to the pressure in the buffer chamber 10. Then, the cylinder 52 is actuated to open the second vacuum opening/closing means 50, whereby the buffer chamber 10 is communicated with the vacuum pre-chamber 60. Under these conditions, the motor 133 is driven to lower the cassette table 131 by one pitch. Therefore, the substrate 30 loaded in the lowermost part of the supply cassette 70 is placed on the belt 93 in a horizontal manner with the surface to be treated being directed upwards. Then, the belt 93 is driven by the motor 94, and the substrate 30 placed thereon is carried toward the side of second vacuum opening/closing means 50, whereby the substrate 30 is transferred, via the second vacuum opening/closing means 50 to the belt 112 that is driven by the motor 111.

The substrate 30 transferred to the belt 112 is carried to the side of belt carrier device 80. The whole belt carrier device 80 has been lowered by the cylinders 81 such that the level of belt 83 will be lower than the level of belt 112. Then, at the moment when the substrate 30 is carried to across the span between pulleys 113 and 114, the whole belt carrier device 80 is raised by the cylinders 81 so that the level of belt 83 becomes higher than the level of belt 112. Thus, the substrate 30 is transferred from the belt 112 to the belt 83 in a horizontal manner with the surface to be treated being directed upwards.

The substrate 30, transferred to the belt 83, is carried, driven by the motor 82, to a position corresponding to the sample table 141. Then, the substrate 30 is placed on the orientation flat by, for example, a positioning device 170. The sample table 141 is then raised by the cylinder 142, so that the substrate 30 is received by the sample table 141. The substrate 30 received by the sample table 141 is then transferred to the sample scoop fitting 151, whereby the arm 152 is turned by the pulse motor 153 toward the processing chamber 20. That is to say substrate 30 is carried through the buffer chamber 10 to a position over the substrate electrode 21 in the processing chamber 20 in a horizontal manner with the surface to be treated being directed upwards.

Then, the pin 24 is raised by the cylinder 25, whereby the substrate 30 on the sample scoop fitting 151 is received by the pin 24. After the substrate 30 is transferred to the pin 24, the sample scoop fitting 151 is retracted into the buffer chamber 10 outside the processing chamber 20. Thereafter, the pin 24 is lowered by the cylinder 25 so that the surface thereof is lower than the surface of the substrate electrode 21; i.e., the substrate 30 is transferred from the pin 24 to the substrate electrode 21 and is placed thereon.

The buffer chamber 10 is then separated from the processing chamber 20 by separating means 183 which includes a separating flange 180, a bellows 181 provided between the back surface of the flange 180 and the bottom wall of the buffer chamber 10, and a hoist device such as a cylinder 182 which raises and lowers the flange 180. Under these conditions, the electrode gap between the substrate electrode 21 and an opposing electrode (not shown) that is provided in the processing chamber 20 over the substrate electrode 21 and opposed thereto, is properly adjusted by driving the motor 23.

The process gas is introduced into the processing chamber 20 by adjusting the flow rate, and the vacuum pump (not shown) is actuated to adjust the pressure in the processing chamber 20; i.e., to establish the processing pressure. Then, high-frequency electric power is applied to the substrate electrode 21 from a power source such as high-frequency power source (not shown) which is connected to the substrate electrode 21, whereby a glow discharge takes place between the opposing electrode and the substrate electrode 21. The process gas is then turned into a plasma by the electric discharge. Due to the plasma, the substrate 30 placed on the substrate electrode 21 is subjected to a predetermined processing such as etching. During this moment, another substrate 30 is taken out from the supply cassette 70 by the aforementioned operation, carried by the belt carrier devices 110, 80, transferred to the sample table 141, placed in position thereon, and is transferred to the sample scoop fitting 151.

After the processing is finished in the processing chamber 20, the separation between the buffer chamber 10 and the processing chamber 20 by the separating means 183 is removed; i.e., the processing chamber 20 is communicated again with the buffer chamber 10. Then, the substrate electrode 21 is lowered to a predetermined position where the pin 24 is raised by the cylinder 25, so that the substrate 30 which is treated is removed from the substrate electrode 21 and is transferred to the pin 24. Then, the sample scoop fitting 161 is turned to a position which corresponds to the back surface of the substrate 30 that has been transferred to the pin 24, and the pin 24 is lowered by the cylinder 25 to transfer to the sample scoop fitting 161 the substrate 30 which has been treated. The substrate 30 transferred to the sample scoop fitting 151 is carried from the sample table 141 to the substrate electrode 21, and the substrate 30 which is transferred to the sample scoop fitting 161 and which has been treated, is carried from the substrate electrode 21 to the sample table 141.

The substrate 30 carried to the substrate electrode 21 is subjected to predetermined processing in accordance with the operation mentioned above. At this time, the substrate 30 which has been treated and which is carried onto the sample table 141 is transferred to the belt 83 of the belt carrier device 80 by lowering the sample table 141 by the cylinder 142, and is then carried to the side of second vacuum opening/closing means 51 being driven by the motors 82, 121 of belts 83, 122. The treated substrate 30 is transferred from the belt 83 over to the belt 122 according to the operation which is the reverse of that of transferring the substrate 30 from the belt over to the belt 83.

The second vacuum opening/closing means 51 is opened by the cylinder 53 and the belt 103 is driven by the motor 104. Therefore, the treated substrate 30 carried to the side of second vacuum opening/closing means 51 is introduced into the vacuum pre-chamber 60 via the second vacuum opening/closing means 51. The cassette table is then raised by one pitch so that the treated substrate 30 is recovered by the recovery cassette 71. The next substrate 30 is removed from the supply cassette 70 by the procedure mentioned in the foregoing, carried by the belt carrier devices 110, 80, transferred to the sample table 141, placed in position thereon, and is transferred to the sample scoop fitting 151.

By repeating the above-mentioned operation, the substrates 30 are removed one at a time from the supply cassette 70, carried from the vacuum pre-chamber 60 to the processing chamber 20 via the buffer chamber 10, and individually treated in the processing chamber 20, and the treated substrates 30 are carried from the processing chamber 20 to the vacuum pre-chamber 60 via the buffer chamber 10, and are individually by the recovery cassette 71.

Figure 1:
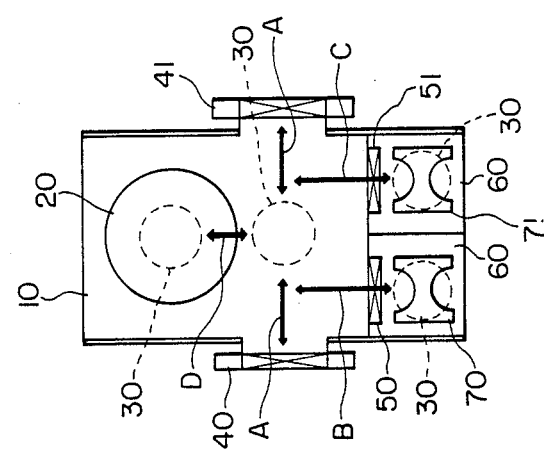
FIG. 1 is a plan view showing a vacuum processing unit according to an embodiment of the present invention.
Figure 3:
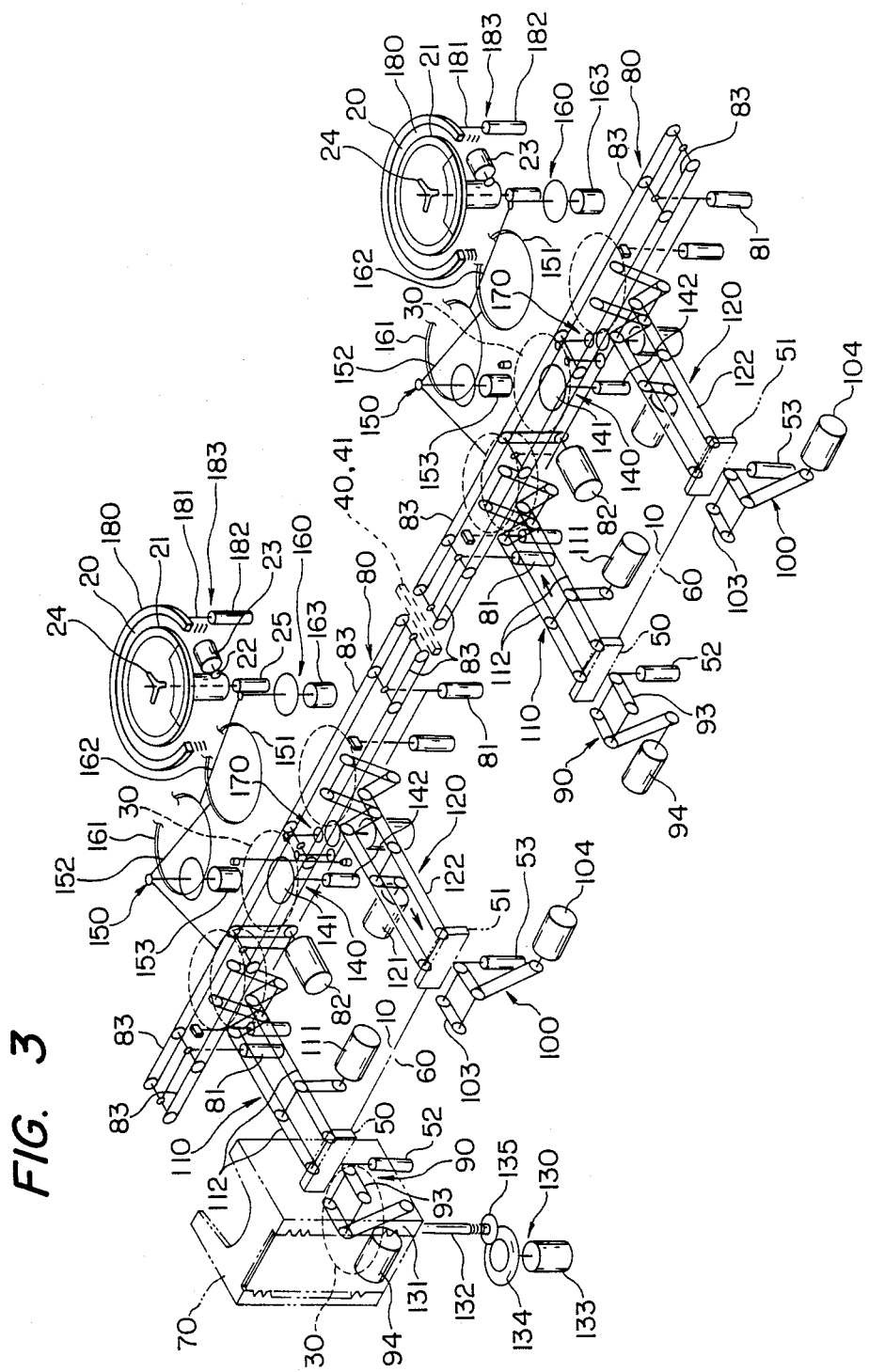
FIG. 3 is a perspective structural view of sample carrier means in the vacuum processing apparatus when the vacuum processing unit of the type in FIG. 1 are connected in pairs.

FIG. 3 shows the case where the vacuum processing units shown in FIGS. 1 and 2 are connected in pairs via the first vacuum opening/closing means 40, 41. The vacuum processing apparatus shown in FIG. 3 is capable of treating the substrate as shown in FIGS. 4(a) to 4(c).

Figure 4B:
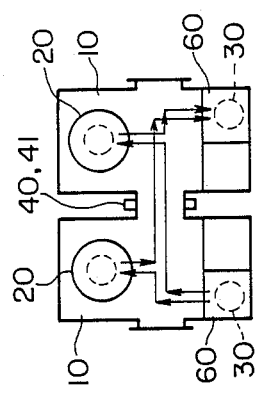
Figure 4C:
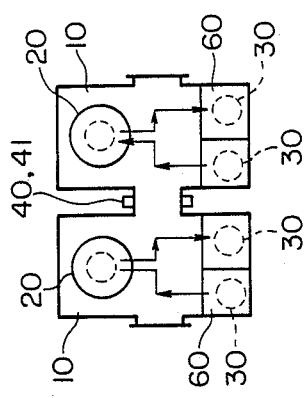

That is to say, the substrates 30 can be treated in series through the two processing chambers 20 of the vacuum processing units connected in pairs as shown in FIG. 4(a), or the substrates 30 can be treated in parallel through the two processing chambers 20 of the vacuum processing units connected in pairs as shown in FIG. 4(b), or the substrates 30 can be processed in parallel through the processing chambers 20 of each of the vacuum processing units connected in pairs as shown in FIG. 4(c).

When the substrates are to be treated by the processing modes shown in FIGS. 4(a) and 4(b), at least one supply cassette (not shown) should be set in the vacuum pre-chamber 60 of the vacuum processing unit of the preceding stage, and at least one recovery cassette (not shown) should be set in the vacuum pre-chamber 60 of the vacuum processing unit of the succeeding stage. In the case of the processing mode shown in FIG. 4(c), at least one supply cassette (not shown) should be set in the vacuum pre-chamber 60 and at least one recovery cassette (not shown) should be set in the vacuum pre-chamber 60 of each of the vacuum processing units. Further, when the vacuum processing units shown in FIGS. 1, 2 are connected in pairs via the first vacuum opening/closing means 40, 41, the substrate 30 in each vacuum processing unit is carried through the buffer chamber 10.

Figure 5A:
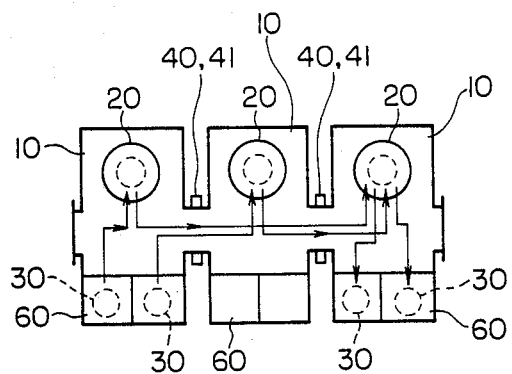
FIGS. 5(a) and 5(b) are schematic views of other sample processing modes in the vacuum processing apparatus consisting of three units.
Figure 5B:
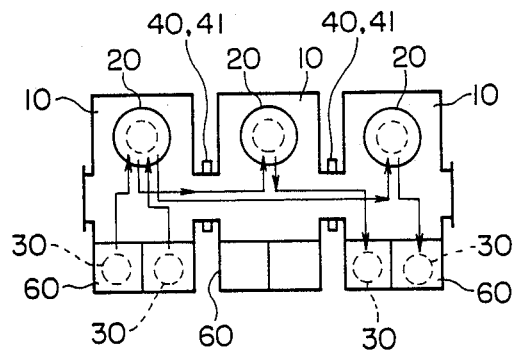

When the vacuum processing units shown in FIGS. 1 and 2 are connected in groups of three or more via the first vacuum opening/closing means 40, 41, the substrates can be processed as shown in FIGS. 5(a) and 5(b) in addition to the processing modes shown in FIG. 4.

That is, the substrates 30 are first treated in parallel in the processing chamber 20 of the vacuum processing unit of the first stage and in the processing chamber 20 of the vacuum processing unit of, in this case, the middle stage, and the substrates are then treated in series in the processing chamber 20 of the vacuum processing unit of the last stage, as shown in FIG. 5(a). Alternatively, the substrates 30 are first treated in series in the processing chamber 20 of vacuum processing unit of the first stage, and are then treated in parallel in the processing chambers 20 of vacuum processing units of the middle and last stage as shown in FIG. 5(b).

In the case of the above-mentioned substrate processing modes, the supply cassettes (not shown) should be set in pairs in the vacuum pre-chamber 60 of the vacuum processing unit of the first stage, and the recovery cassettes (not shown) should be set in pairs in the vacuum pre-chamber 60 of the vacuum processing unit of the last stage.

Further, when the substrates 30 are to be treated in series in the processing chambers 20 of each of the vacuum processing units, the supply cassette should be set singly in the vacuum pre-chamber 60 of the vacuum processing unit of the first stage, and the recovery cassette should be set singly in the vacuum pre-chamber 60 of the vacuum processing unit of the last stage.

When the substrates 30 are to be processed in parallel in the processing chambers of each of the vacuum processing units, at least one supply cassette should be set in the vacuum pre-chamber of the vacuum processing unit of the first stage, and at least one recovery cassette should be set in the vacuum pre-chamber of the vacuum processing unit of the last stage. In the above-mentioned case, it is permissible to eliminate the vacuum pre-chamber from the vacuum processing unit of the middle stage and to eliminate the second vacuum opening/closing means.

When the substrates are to be treated in parallel in the processing chambers of the independent vacuum processing units, the supply cassette and the recovery cassette should each be set singly in the vacuum pre-chamber of each of the vacuum processing units.

Further, even when the vacuum processing units shown in FIGS. 1 and 2 are connected in groups of three or more via the first vacuum opening/closing means 40, 41, the substrates 30 in each of the vacuum processing units are carried via the buffer chamber 10.

The present invention provides the following advantages

The system can be constituted or assembled by freely changing the number of processing chambers to cope with a change in the process or a change in the line.

The substrate is carried to the next processing chamber via the buffer chamber which has been evacuated. Therefore, the apparatus of the invention can be adapted to such a process in which processing is transferred to the next processing chamber during processing.

The second sample carrier means and the third sample carrier means can be arranged in parallel to reduce the width of front surface of the vacuum processing units, so that the units can be easily connected in a groups.

The vacuum pre-chamber is used as a cassette chamber that can be evacuated; therefore, the depth of the vacuum processing unit can be reduced. In a multi-unit system, two cassettes can be set to each unit, thereby lengthening the time interval between setting cassettes so that throughput is enhanced.

Arm carrier devices having dissimilar planes of operation are used as the third sample carrier means. Therefore, the substrates can be carried into, or out of, the processing chamber simultaneously, to enhance the throughput.

The substrates can be processed as multiple units in series or in parallel. Therefore, the vacuum processing apparatus can be significantly smaller than devices in the current state of the art, and throughput per unit floor area can be enhanced.

The opening area of the vacuum opening/closing means provided for the buffer chamber needs to be just large enough to permit the passage of a piece of substrate. In the multi-unit system; therefore, there is virtually no flow of residual process gas between the vacuum processing units, and the individual vacuum processing units remain sealed against the process gas.

Figure 6:
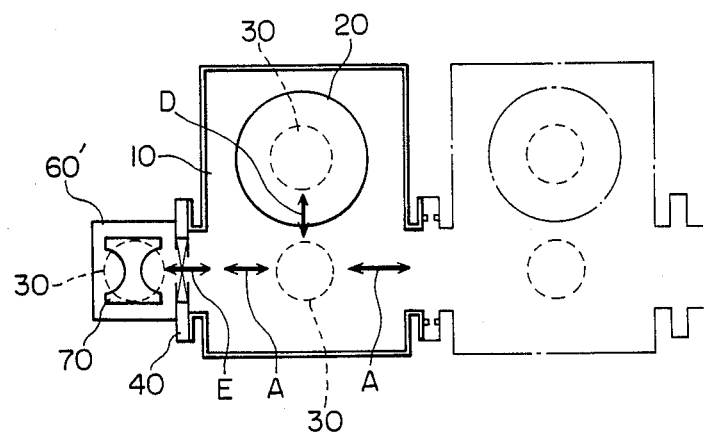
FIG. 6 is a plan view of a vacuum processing apparatus according to another embodiment of the present invention.

When it is desired to reduce the depth of the vacuum processing unit and to effect processing continuously and consistently together with other apparatus, a vacuum pre-chamber 60' should be provided for the buffer chamber 10 via the first vacuum opening/closing means 40 as shown in FIG. 6, and a belt carrier device (not shown) that serves as the second sample carrier means should be provided in the vacuum pre-chamber 60' so as to transfer the substrate 30 in the directions of arrow E via the first vacuum opening/closing means 40 relative to the belt carrier device (not shown) which is the first sample carrier means that carries the substrate 30 in the directions of arrow A. In this case, the second vacuum opening/closing means is not required.

In the above-mentioned embodiment, the supply cassette and recovery cassette are inserted and set into the vacuum pre-chamber from the external side. However, the cassettes need not necessarily be set into such a vacuum pre-chamber. For instance, the supply cassette and recovery cassette may be secured to the vacuum pre-chamber; the substrates may be externally loaded in a predetermined number into the supply cassette; and the substrates recovered in the recovery cassettes may be removed from the recovery cassette and may be carried out of the system.

Further, in addition to the belt carrier device, the first sample carrier means may be the one which carries the substrate to and from the vacuum opening/closing means that is provided for the buffer chamber. In addition to the belt carrier device, the second sample carrier means may be, for example, an arm carrier device in which the arm proceeds straight, or an arm carrier device in which the arm rotates.

According to the present invention, a plurality of vacuum processing units can be connected via an opening provided the buffer chamber. Namely, the system can be constituted or assembled by freely changing the number of processing chambers to meet a change in the process or a change in the line.

What is claimed is:

1. A vacuum processing unit comprising:
   a processing chamber means for processing a sample under a vacuum;
   a substantially rectangular buffer chamber means adapted to be evacuated and communicatable with said processing chamber means, said buffer chamber means having a width adapted for only one said processing chamber means;
   a vacuum prechamber means communicatable with said buffer chamber means by vacuum opening/closing means for opening and closing a first opening provided in a first side wall of said buffer chamber means;
   a first sample carrier means provided inside said buffer chamber means so as to enable a carrying of said sample inside said buffer chamber means;
   a second sample carrier means for carrying said sample between said vacuum prechamber means and said first sample carrier means through said first opening;
   a third sample carrier means for carrying said sample between said first sample carrier means and said processing chamber means, wherein said third sample carrier means includes two sample scoop fittings, two arms of which each have one of said sample scoop fittings attached at one end thereof, said two arms being adapted to move on different planes, and a rotating device which partially rotates said arms with the other ends thereof as centers of rotation; and
   wherein said buffer chamber means includes at least one further opening and at least one further vacuum opening/closing means for opening and closing said at least one further opening, said at least one further opening being provided at a location different from the location of said first opening so as to enable said sample to be removed and delivered between said first sample carrier means and outside said buffer chamber means, said at least one further opening being provided in at least one side wall of the buffer chamber means disposed substantially normal to said first side wall and being non-communicatable with said processing chamber means and said vacuum prechamber means.

2. A vacuum processing unit according to claim 1, wherein said first sample carrier means and said second sample carrier means includes a belt carrier device for carrying said sample in a horizontal position with a surface being processed being disposed upwardly.

3. A vacuum processing apparatus comprising at least two connected vacuum processing units, wherein each of said vacuum processing units comprises:
   a processing chamber means for processing a sample under a vacuum;
   a substantially rectangular buffer chamber means adapted to be evacuated and communicatable with said processing chamber means;
   a vacuum pre-chamber means communicatable with said buffer chamber means through a first vacuum opening/closing for opening and closing a first opening in a first side wall of said buffer chamber means;
   sample carrier means for carrying the sample between said vacuum prechamber means and said buffer chamber means, inside said buffer chamber means and between said buffer chamber means and said processing chamber means;
   wherein said buffer chamber means includes at least one further opening at a location different from a location of said first opening so as to enable said sample to be removed and delivered between said sample carrier means to carry said sample inside the buffer chamber means and outside the buffer chamber means, said at least one further opening being provided in at least one side wall of the buffer chamber means disposed substantially normal to said first side wall and being non-communicatable with said prechamber means; and
   wherein the two vacuum processing units are connected to each other in such a fashion that said buffer chamber means of one vacuum processing unit is capable of being communicated with said buffer chamber means of an adjoining vacuum processing unit through said at least one further opening.

4. A vacuum processing apparatus according to claim 3, wherein said at least two processing chamber means individually process a sample under a vacuum, and a cassette means for housing and collecting said sample is positionable in and out of said vacuum prechamber means.

5. A vacuum processing unit comprising:
a processing chamber means for individually processing a sample under a vacuum:
a substantially rectangular buffer chamber means adapted to be evacuated and communicatable with said processing chamber means, said buffer chamber means having a width adapted for only one said processing chamber means;
a vacuum prechamber means communicatable with said buffer chamber means through a first vacuum opening/closing means for opening and closing a first opening in a first side wall of said buffer chamber means;
a first sample carrier means provided inside said buffer chamber means so as to enable a carrying of said sample inside said buffer chamber means, wherein said first sample carrier means includes a first belt carrier device for carrying said sample in a horizontal position with a surface being processed being disposed upwardly;
a sample transfer means provided in a sample carrying transfer path of said first sample carrier means so as to enable removal and delivery of said sample from and to said first sample carrier means;
an orientation adjusting means for adjusting a flat orientation of said sample delivered to said sample transfer means from said first sample carrier means;
a second sample carrier means for carrying said sample between said vacuum prechamber means and said first sample carrier means through said first opening, said second sample carrier means includes a second belt carrier device and a third belt carrier device for carrying said sample in a horizontal position with a surface being processed being disposed upwardly, said second belt carrier device being installed in the vacuum prechamber means, and said third belt carrier device being installed in the buffer chamber means with said first opening;
a third sample carrier means for carrying said sample between said first sample carrier means and said processing chamber means, said third sample carrier means includes two arms, each arm having a sample scoop fitting attached at one end thereof, said arms moving on different planes, and a rotating device which partially rotates said arms with the other ends thereof as centers of rotation; and
wherein said buffer chamber means includes at least one further opening at a location different from a location of said first opening so as to enable said sample to be removed and delivered between said first sample carrier means and outside said buffer chamber means, said at least one further opening being provided in at least one side wall of the buffer chamber means disposed substantially normal to said first side wall and being non-communicatable with said processing chamber means and said vacuum prechamber means.

6. A vacuum processing unit according to claim 5, wherein said first belt carrier belt is disposed so as to ascend and descend inside said buffer chamber means thereby enabling a removal and delivery of said sample from and to a belt of said third belt carrier device.

7. A vacuum processing unit comprising:
a processing chamber means for individually processing a sample under a vacuum;
a substantially rectangular buffer chamber means adapted to be evacuated and communicatable with said processing chamber means, wherein said buffer chamber means having a width adapted for only one said processing chamber means includes at least two openings in a first side wall, each of said openings being controlled by a vacuum opening/closing means;
at least two vacuum prechamber means communicatable with the two openings of the buffer chamber means through said vacuum opening/closing means;
a first sample carrier means provided inside said buffer chamber means so as to enable a carrying of said sample inside said buffer chamber means;
a sample transfer means provided in a sample carrying transfer path of said first sample carrier means so as to enable removal and delivery of said sample from and to said first sample carrier means;
an orientation adjusting means for adjusting a flat orientation of said sample delivered to said sample transfer means from said first sample carrier means;
a second sample carrier means for carrying said sample between each of said at least two vacuum prechamber means and said first sample carrier means through each of said openings, said second sample carrier means includes two series of sample carrier means, one series of sample carrier means being capable of removing and delivering said sample from and to said one sample carrying end of said first sample carrier means having said sample transfer means in a sample carrying transfer path thereof and which carries said sample between said first sample carrier means and one of the vacuum prechamber means through one of said opening, and another series adapted to remove and deliver said sample from and to the other sample carrying end of said first sample carrier means and which carries said sample between said first sample carrier means and the other of said vacuum prechamber means through the other of said openings;
a third sample carrier means for carrying said sample between said first sample carrier means and said processing chamber means, said third sample carrier means includes two arms, each arm having a sample scoop fitting attached at one end thereof, said arms moving on different planes, and a rotating device which partially rotates said arms with the other ends thereof as centers of rotation; and
wherein said buffer chamber means includes at least one further opening at a location different from a location of said openings so as to enable said sample to be removed and delivered between said first sample carrier means and outside said buffer chamber means, said at least one further opening being provided in at least one side wall of the buffer chamber means disposed substantially normal to said first side wall and being non-communicatable with said processing chamber means and said at least two vacuum prechamber means.

8. A vacuum processing apparatus comprising at least two connected vacuum processing units, wherein each of said vacuum processing units comprises:
- a processing chamber means for processing an individual sample under a vacuum;
- a substantially rectangular buffer chamber means adapted to be evacuated and communicatable with said processing chamber means;
- a vacuum prechamber means communicatable with said buffer chamber means through a first vacuum opening/closing means for opening and closing a first opening provided in a first side wall of said buffer chamber means and to and from which a cassette means for housing and collecting said sample is positionable in and out of;
- a first sample carrier means is provided inside said buffer chamber means so as to enable a transfer of said sample inside said buffer chamber means;
- a sample transfer means provided in a sample carrying transfer path of said first sample carrier means so as to remove and deliver said sample from and to said first sample carrier means;
- an orientation-flat adjusting means for adjusting a flat orientation of said sample delivered to said sample transfer means from said first sample carrier means;
- a second sample carrier means for carrying said sample between said cassette means carried in said vacuum prechamber means and said first sample carrier means through said first opening;
- a third sample carrier means for carrying said sample between said sample transfer means and said processing chamber means;
- wherein said buffer chamber means includes at least one further opening and at least one further vacuum opening/closing means for opening and closing said at least one further opening, said at least one further opening being provided at a location different from a location of said first opening so as to enable said sample to be removed and delivered between said first sample carrier means and outside said buffer chamber means, said at least one further opening being provided in at least one side wall of the buffer chamber means disposed substantially normal to said first said wall and being non-communicatable with said prechamber means, and wherein the two vacuum processing units are connected to each other in such a fashion that said buffer chamber means of one vacuum processing unit is capable of being communicated with said buffer chamber means of an adjoining vacuum processing unit through said at least one further opening.

9. A vacuum processing unit comprising:
- a processing chamber means for processing a sample under a vacuum;
- a substantially rectangular evacuatable buffer chamber means communicatable with said processing chamber means;
- a vacuum prechamber means communicatable with said buffer chamber means by vacuum opening/closing means for opening and closing a first opening provided in a first side wall of said buffer chamber means;
- sample carrier means for carrying the sample between said vacuum prechamber means and said buffer chamber means, inside said buffer chamber means and between said buffer chamber means and said processing chamber means; and
- wherein said buffer chamber means includes at least one further opening and at least one further vacuum opening/closing means for opening and closing said at least one further opening, said at least one further opening being provided at a location different from the location of said first opening so as to enable said sample to be removed and delivered between said sample carrier means for carrying said sample inside said buffer chamber means and inside of another buffer chamber means of an adjacent vacuum processing unit also having a processing chamber means, said at least one further opening being provided in at least one side wall of the buffer chamber means disposed substantially normal to said first side wall and being non-communicatable with said processing chamber means and said vacuum prechamber means.

* * * * *